(12) United States Patent
Iwata et al.

(10) Patent No.: US 11,024,798 B2
(45) Date of Patent: Jun. 1, 2021

(54) PROTECTIVE PASSIVATION LAYER FOR MAGNETIC TUNNEL JUNCTIONS

(71) Applicant: Taiwan Semiconductor Manufacturing Company, Ltd., Hsinchu (TW)

(72) Inventors: Jodi Mari Iwata, San Carlos, CA (US); Guenole Jan, San Jose, CA (US); Ru-Ying Tong, Los Gatos, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/594,339

(22) Filed: Oct. 7, 2019

(65) Prior Publication Data

US 2020/0035912 A1    Jan. 30, 2020

Related U.S. Application Data

(62) Division of application No. 15/463,113, filed on Mar. 20, 2017, now Pat. No. 10,439,132.

(51) Int. Cl.
*H01L 43/08* (2006.01)
*H01L 21/02* (2006.01)
(Continued)

(52) U.S. Cl.
CPC ........... *H01L 43/08* (2013.01); *H01F 10/329* (2013.01); *H01L 21/02172* (2013.01);
(Continued)

(58) Field of Classification Search
CPC ....... H01L 27/222; H01L 43/08; H01L 43/10; H01L 43/12; H01L 21/02107;
(Continued)

(56) References Cited

U.S. PATENT DOCUMENTS 7,009,266 B2    3/2006  Shi et al.
8,455,965 B2    6/2013  Li et al.
(Continued)

FOREIGN PATENT DOCUMENTS

JP    2011166060       8/2011
KR    2013-0007410 A   1/2013
KR    2015-0015920 A   2/2015

OTHER PUBLICATIONS

PCT Search Report, International Application No. PCT/US2018/020075, Applicant: Headway Technologies, Inc., dated Jun. 22, 2018, 15 pages.
(Continued)

*Primary Examiner* — Sonya McCall-Shepard
(74) *Attorney, Agent, or Firm* — Haynes and Boone, LLP

(57) ABSTRACT

A magnetic device for magnetic random access memory (MRAM), spin torque MRAM, or spin torque oscillator technology is disclosed wherein a magnetic tunnel junction (MTJ) with a sidewall is formed between a bottom electrode and a top electrode. A passivation layer that is a single layer or multilayer comprising one of B, C, or Ge, or an alloy thereof wherein the B, C, and Ge content, respectively, is at least 10 atomic % is formed on the MTJ sidewall to protect the MTJ from reactive species during subsequent processing including deposition of a dielectric layer that electrically isolates the MTJ from adjacent MTJs, and during annealing steps around 400° C. in CMOS fabrication. The single layer is about 3 to 10 Angstroms thick and may be an oxide or nitride of B, C, or Ge. The passivation layer is preferably amorphous to prevent diffusion of reactive oxygen or nitrogen species.

20 Claims, 9 Drawing Sheets

(51) Int. Cl.
*H01L 43/12* (2006.01)
*H01L 27/22* (2006.01)
*H01F 10/32* (2006.01)
*H03B 15/00* (2006.01)
*H01L 43/02* (2006.01)

(52) U.S. Cl.
CPC .. *H01L 21/02323* (2013.01); *H01L 21/02329* (2013.01); *H01L 27/222* (2013.01); *H01L 43/02* (2013.01); *H01L 43/12* (2013.01); *H03B 15/006* (2013.01)

(58) Field of Classification Search
CPC ........... H01L 21/02323; H01L 21/0223; H01L 21/02249; H01L 21/02247; H01L 21/02329; G11C 2211/5615; G11C 11/161; H01F 10/329
See application file for complete search history.

(56) References Cited

U.S. PATENT DOCUMENTS

| | | | |
|---|---|---|---|
| 8,482,966 B2 | 7/2013 | Kang et al. | |
| 8,709,956 B2 | 4/2014 | Satoh et al. | |
| 8,796,795 B2 | 8/2014 | Satoh et al. | |
| 8,796,814 B2 | 8/2014 | Ogihara | |
| 9,166,151 B2 | 10/2015 | Murayama et al. | |
| 9,190,260 B1 | 11/2015 | Zhang et al. | |
| 9,230,571 B1 | 1/2016 | Chen et al. | |
| 9,281,168 B2 | 3/2016 | Mudivarthi et al. | |
| 2010/0311243 A1* | 12/2010 | Mao | H01L 43/12 438/694 |
| 2011/0051295 A1 | 3/2011 | Hara et al. | |
| 2013/0001652 A1 | 1/2013 | Yoshikawa et al. | |
| 2015/0008444 A1 | 1/2015 | Derluyn et al. | |
| 2015/0035031 A1 | 2/2015 | Kim | |
| 2016/0141489 A1 | 5/2016 | Zhang et al. | |
| 2016/0163971 A1 | 6/2016 | Jeong | |
| 2017/0018706 A1 | 1/2017 | Xue et al. | |
| 2017/0263861 A1 | 9/2017 | Park et al. | |
| 2018/0005746 A1* | 1/2018 | Thomas | H01L 43/10 |
| 2018/0076261 A1 | 3/2018 | Yoshikawa et al. | |
| 2018/0269385 A1 | 9/2018 | Iwata et al. | |

OTHER PUBLICATIONS

C. Mitterer et al., "Radio-frequency sputter deposition of boron nitride based thin films," Journal of Vacuum Science & Technology, A7, 2646, (1998), published online: Jun. 4, 1998, accepted: Jan. 1989, vol. 7, Issue 4, doi: 10.111/1.575767, pp. 2646-2651.

* cited by examiner

PROTECTIVE PASSIVATION LAYER FOR MAGNETIC TUNNEL JUNCTIONS

PRIORITY DATA

The present application is a divisional application of U.S. application Ser. No. 15/463,113, entitled "Protective Passivation Layer for Magnetic Tunnel Junctions," filed Mar. 20, 2017, which application is herein incorporated by reference in its entirety.

RELATED PATENT APPLICATION

This application is related to the following: U.S. Pat. No. 9,230,571; assigned to a common assignee, and herein incorporated by reference in its entirety.

TECHNICAL FIELD

The present disclosure relates to magnetic tunnel junctions (MTJs) in magnetic random access memory (MRAM), spin-torque MRAM, and other spintronic devices, and in particular to protecting MTJ sidewalls during processing steps including the deposition of an insulating dielectric layer that separates adjacent MTJs, and during high temperature annealing around 400° C. that is common in Complementary Metal Oxide Semiconductor (CMOS) fabrication.

BACKGROUND

A MTJ is a key component in MRAM, spin-torque MRAM, and other spintronic devices and comprises a stack with a tunnel barrier layer such as a metal oxide formed between two magnetic layers that provides a tunneling magnetoresistance (TMR) effect. One of the magnetic layers is a free layer and serves as a sensing layer by switching the direction of its magnetic moment in response to external fields while the second magnetic layer has a magnetic moment that is fixed and functions as a reference layer. The electrical resistance through the tunnel barrier layer (insulator layer) varies with the relative orientation of the free layer moment compared with the reference layer moment and thereby provides an electrical signal that is representative of a magnetic state in the free layer. In a MRAM, the MTJ is formed between a top conductor and bottom conductor. When a current is passed through the MTJ, a lower resistance is detected when the magnetization directions of the free and reference layers are in a parallel state and a higher resistance is noted when they are in an anti-parallel state. Since MTJ elements are often integrated in CMOS devices, the MTJ must be able to withstand annealing temperatures around 400° C. for about 30 minutes that are commonly applied to improve the quality of the CMOS units for semiconductor purposes.

MTJ elements wherein the free layer (FL) and reference layer (RL) have perpendicular magnetic anisotropy (PMA) are preferred over their counterparts that employ in-plane anisotropy because a PMA-MTJ has an advantage in a lower writing current for the same thermal stability, and better scalability. In MTJs with PMA, the FL has two preferred magnetization orientations that are perpendicular to the physical plane of the layer. Without external influence, the magnetic moment of the free layer will align to one of the preferred two directions, representing information "1" or "0" in the binary system. For memory applications, the FL magnetization direction is expected to be maintained during a read operation and idle, but change to the opposite direction during a write operation if the new information to store differs from its current memory state. CoFeB or the like is commonly used as the FL and RL, and MgO is preferred as the tunnel barrier to generate PMA along the RL/MgO and MgO/FL interfaces in a RL/MgO/FL stack.

Spin-torque (STT)-MRAM based technologies are desirable for nonvolatile memory applications. However, realizing low critical dimensions below 100 nm that match those found in Dynamic Random Access Memory (DRAM) is a challenge. MTJs are highly susceptible to sidewall damage, both chemical and physical, induced by etching and deposition processes, and exacerbated by the CMOS process requirement of annealing at 400° C.

During fabrication of a conventional STT-MRAM device where a dielectric layer is deposited on MTJ sidewalls in order to insulate the MTJ from adjacent MTJ devices in the STT-MRAM array, damage frequently occurs to the MTJ sidewalls. Damage may result from oxygen diffusion through a MTJ sidewall during an oxide dielectric layer deposition, for example, and thereby oxidize a significant portion of the MTJ. In some cases, metal from a MTJ capping layer may be redeposited on MTJ sidewalls to cause shunting around the tunnel barrier layer, or electrical short circuits. As a result, there is a reduction in device performance, substantial non-uniformity between bits that translates into an undesirable larger distribution of key metrics, and lower device yields. Reducing sidewall damage is especially important at the CoFeB/MgO (RL/tunnel barrier and tunnel barrier/FL) interfaces that generate interfacial PMA. Furthermore, the delicate nature of the MgO tunnel barrier layer is well known to have poor corrosion properties and readily degrades when exposed to atmosphere during deposition of the insulating dielectric layer.

Although methods are available to remove sidewall damage caused by ion bombardment, and by exposure to atmosphere during dielectric layer deposition, the methods are generally time consuming and costly. Moreover, some sidewall damage may be too extensive to repair. There is a need to prevent MTJ sidewall damage by providing a means of protecting a MTJ element during subsequent process steps in memory device fabrication.

SUMMARY

One objective of the present disclosure is to substantially improve the resistance of a MTJ to sidewall damage during etching, deposition, and annealing processes in memory device fabrication.

A second objective of the present disclosure is to provide a method of delivering the MTJ integrity improvement according to the first objective that is compatible with back end of line (BEOL) CMOS processes.

According to one embodiment of the present disclosure, these objectives are achieved by depositing a protective passivation layer on a MTJ sidewall during fabrication of a memory device. The passivation layer may be RF magnetron sputtered, or formed by an atomic layer deposition (ALD) technique, chemical vapor deposition (CVD) method, or a physical vapor deposition (PVD) method. According to one preferred embodiment, the passivation layer is a single layer of B, C, or Ge that is sputter deposited with a RF power from about 100 to 1000 Watts in the absence of a reactive species such as nitrogen containing and oxygen containing gases and plasmas. The passivation layer has a thickness of at least 3 Angstroms to enable a continuous coating. Preferably, the passivation layer is amorphous and not crystalline to prevent diffusion of reactive materials between crystals in a lattice.

In another embodiment, an oxidation process such as a natural oxidation (NOX) is employed to partially or totally oxidize a B layer to BO, a C layer to CO, or a Ge layer to GeO passivation layer. Alternatively, a B, C, or Ge layer is deposited in a first step, and is then exposed to a nitridation or oxynitridation process to form a BN, CN, GeN, BON, CON, or GeON passivation layer, respectively, having a non-stoichiometric or stoichiometric N content. Depending on the conditions employed in the aforementioned oxidation process, a B/BO bilayer, C/CO bilayer, or Ge/GeO bilayer may be formed. In another embodiment, a B, C, or Ge passivation layer reacts with oxygen species during deposition of a dielectric layer and is partially or totally oxidized to a BO, CO, or GeO passivation layer.

In another embodiment, a passivation layer that comprises an alloy may be fabricated by a two step deposition sequence. In particular, an alloy with a BX, CX, or GeX composition is formed by a first step of depositing a B, C, or Ge layer, and then a second step of depositing an X element where X is one of B, C, Ge, Si, Al, P, Ga, In, TI, Mg, Hf, Zr, Nb, V, Ti, Cr, Mo, W, Sr, and Zn, and where X is unequal to the other element in the alloy. In other words, the initially deposited B, C, or Ge layer serves as a sacrificial material and is completely resputtered during the X deposition, and combines with the X element to form an alloy. Preferably, B in BX, C in CX, and Ge in GeX has a content of at least 10 atomic %.

According to another embodiment, the two step deposition previously described is followed. However, during the second step involving X deposition, only an upper (outer) portion of the B, C, or Ge first passivation layer is resputtered to form a second passivation layer comprised of BX, CX, or GeX, respectively, thereby generating a B/BX, C/CX, or Ge/GeX bilayer structure as a composite passivation layer. Here, the duration of the second deposition is shortened, or the process conditions during the X deposition may be adjusted to employ a weaker RF power, for example, to prevent the entire B, C, or Ge layer from being resputtered.

A two step deposition process is advantageous in that the first step of depositing a B, C, or Ge layer is effective in protecting MTJ sidewalls from reactive species such as oxygen. The second step of depositing an X material to form either a bilayer or a single alloy layer is primarily relied on to prevent damage to MTJ sidewalls from high-energy ions during subsequent processes including dielectric layer deposition.

In yet another embodiment where two deposition steps are used to form a passivation layer, one or both of oxygen and nitrogen may be included in the second deposition step. Thus, the present disclosure anticipates formation of a bilayer such as B/BXO, C/CXO, Ge/GeXO, B/BXN, C/CXN, Ge/GeXN, B/BXON, C/CXON, or Ge/GeXON when depositing an X layer on a B, C, or Ge layer in the presence of a reactive species that comprises one or both of an oxygen species and a nitrogen species. Furthermore, the oxide, nitride, and oxynitride layers may be a composite such that a BXO layer, for example, comprises BO and BX, BXN comprises BN and BX, and BXON comprises BON and BX, respectively.

In the completed memory structure that may be a MRAM, STT-MRAM, or spin torque oscillator (STO), there is an array of MTJ elements formed in a plurality of rows and columns on a substrate. In a MRAM or STT-MRAM application, the substrate comprises a bottom electrode layer wherein there is a plurality of conductive lines so that a bottom surface of each MTJ contacts a conductive line. Each MTJ has a sidewall that is protectively covered by a passivation layer according to an embodiment described herein. Moreover, there is a dielectric layer that contacts a top surface of the passivation layer and fills the spaces between adjacent MTJ elements. The dielectric layer may be comprised of one or more oxides, nitrides, oxynitrides, or carbides used in the art for electrical insulation purposes, and may have a top surface that is coplanar with a top surface of the MTJ. A top electrode layer comprised of a plurality of conductive lines is formed on the array of MTJ elements such that each MTJ is formed between a bottom electrode and a top electrode.

In a STO device, the substrate may be a main pole layer that serves as a bottom electrode, and the top electrode may be a trailing shield, for example. A passivation layer is formed on a side of the STO stack of layers that faces away from an air-bearing surface (ABS).

DETAILED DESCRIPTION

Figure 1:
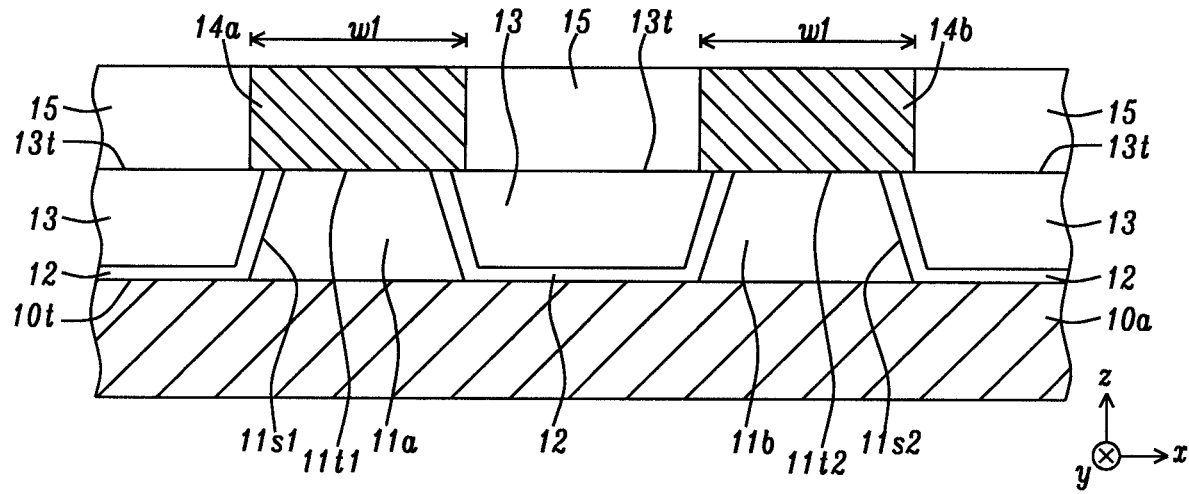
FIG. 1 is a cross-sectional view that depicts a memory structure having a passivation layer made of a single element formed on MTJ sidewalls, and with an overlying dielectric layer according to an embodiment of the present disclosure.

The present disclosure relates to improved structural integrity in MTJ elements, especially during processes that involve deposition of dielectric layers between MTJ sidewalls, and exposure to high temperatures around 400° C. The MTJ elements may be formed in a variety of memory devices including but not limited to MRAM, spin-torque MRAM, and other spintronic devices such as a spin torque oscillator (STO). In the drawings, a thickness of a layer is in the z-axis direction, a width is in the x-axis direction, and a length is in the y-axis direction. The terms "dielectric" and "insulation" may be used interchangeably.

As mentioned previously, many memory devices are now incorporated into CMOS platforms in order to provide higher performance. However, we observe substantially higher defects and degraded device performance when dielectric layers are deposited directly on MTJ sidewalls by conventional methods, and the resulting device is annealed at temperatures around 400° C. that are required in CMOS processing. Thus, we were motivated to implement a means of protecting MTJ elements to provide higher performance and yields in memory applications.

Referring to FIG. 1, a first embodiment of the present disclosure is shown wherein a memory device comprises a plurality of MTJs including MTJ 11a and MTJ 11b that have sidewalls 11s1 and 11s2, respectively, and are protected by a passivation layer 12. MTJ 11a is formed between a bottom electrode 10a and a top electrode 14a while MTJ 11b is between bottom electrode 10a and top electrode 14b. The bottom electrode is a line that extends along the x-axis, and the top electrodes are lines that extend in the y-axis direction in a MRAM or STT-MRAM embodiment. Bottom and top electrodes are typically comprised of one or more metals or alloys to ensure excellent electrical conductivity and resistance to oxidation. There is an insulation layer 15 formed on a substantial portion of dielectric layer top surface 13t. Within the insulation layer is a top electrode layer comprised of a plurality of top electrodes including top electrodes 14a, 14b. Note that each of the top electrodes may have a width w1 that is greater than a width of top surfaces 11t1, and 11t2. In other words, an inner portion of the top electrodes may overlay on passivation layer 12 and an outer portion on top surface 13t that is proximate to the passivation layer.

It should be understood that typically millions of MTJs are aligned in rows and columns in a memory array on a substrate, and each MTJ is formed between a bottom electrode and a top electrode. However, the number of MTJs shown in FIG. 1 is limited to two in order to simplify the drawing. The MTJs may have a variety of configurations but each MTJ has at least a tunnel barrier layer formed between a reference layer (RL) and free layer (FL) in a RL/tunnel barrier/FL or FL/tunnel barrier/RL stack on a substrate (not shown) that is a seed layer, for example.

Preferably, passivation layer 12 has a uniform thickness, and contacts not only MTJ sidewalls 11s1 and 11s2, and other MTJ sidewalls that are not depicted, but also adjoins portions of top surfaces of bottom electrodes such as top surface 10t of bottom electrode 10a that are not covered by MTJs. According to one aspect, the passivation layer is non-magnetic and is a single layer with a thickness of at least 3 Angstroms to enable a continuous coating. In a preferred embodiment, the passivation layer is amorphous and not crystalline to prevent diffusion of reactive materials between crystals in a lattice, and may be a single layer of B, C, or Ge. A carbon passivation layer may have a diamond-like structure or a high degree of sp3 bonding that is deposited by a CVD or PVD method. We have discovered that the maximum advantage of a more uniform coercivity (Hc) over a range of MTJ sizes is minimized for a B passivation layer thickness of about 5 Angstroms, and decreases somewhat when the thickness is increased to 10 Angstroms or more. Furthermore, a key feature of all passivation layers disclosed herein is a capability to protect MTJ sidewalls from attack by reactive species during processes including deposition of a dielectric layer between MTJ elements.

Figure 2:
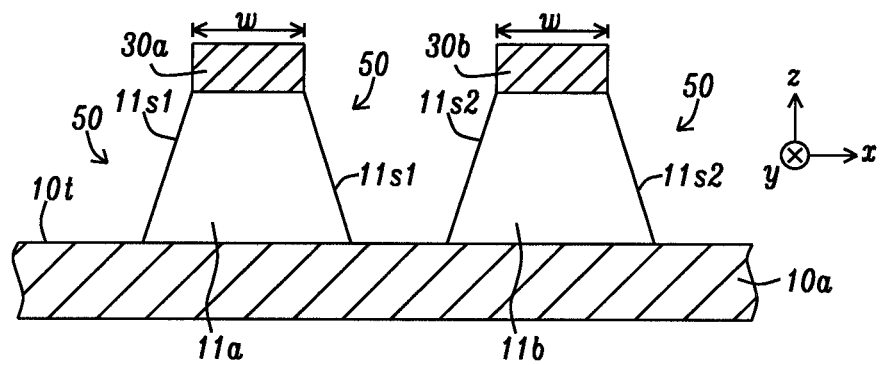
FIGS. 2-5 are cross-sectional views that show a sequence of steps for forming a memory structure having a plurality of MTJ elements with a single passivation layer according to an embodiment of the present disclosure.

The present disclosure also encompasses a method of forming a single passivation layer on the MTJ sidewalls. First, a method of fabricating a plurality of MTJs is described. In FIG. 2, a MTJ stack of layers is formed on a bottom electrode layer that includes bottom electrode 10a. All layers in the MTJ stack may be deposited in a DC sputtering chamber of a sputtering system such as an Anelva C-7100 sputter deposition system that includes ultra high vacuum DC magnetron sputter chambers with multiple targets, and at least one oxidation chamber to form a tunnel barrier such as MgO from a Mg layer, and thereby provide a TMR effect. Typically, the sputter deposition processes for various layers involve an inert gas such as Ar and a base pressure between $5 \times 10^{-8}$ and $5 \times 10^{-9}$ torr.

A photoresist layer is formed on the MTJ stack of layers and is patterned by a well known photolithography technique to give a plurality of islands including photoresist islands 30a, 30b each having a width w. Subsequently, a conventional reactive ion etch (RIE) or ion beam etch (IBE) process is performed to remove regions of the MTJ stack of layers that are not protected by a photoresist island. Note that the photolithography process yields an array of photoresist islands laid out in rows and columns such that each island serves as an etch mask, and the RIE or IBE process generates a MTJ below each etch mask. Thus, MTJ 11a and MTJ 11b are formed with sidewalls 11s1 and 11s2, respectively, below islands 30a and 30b, and there are openings 50 on each side of the MTJs that expose portions of bottom electrode top surface 10t. In the exemplary embodiment, the RIE or IBE process forms non-vertical sidewalls 11s1 and 11s2 such that a bottom of each MTJ at top surface 10t has a greater width than w. However, depending on the etch conditions, substantially vertical MTJ sidewalls may be produced.

Figure 3:
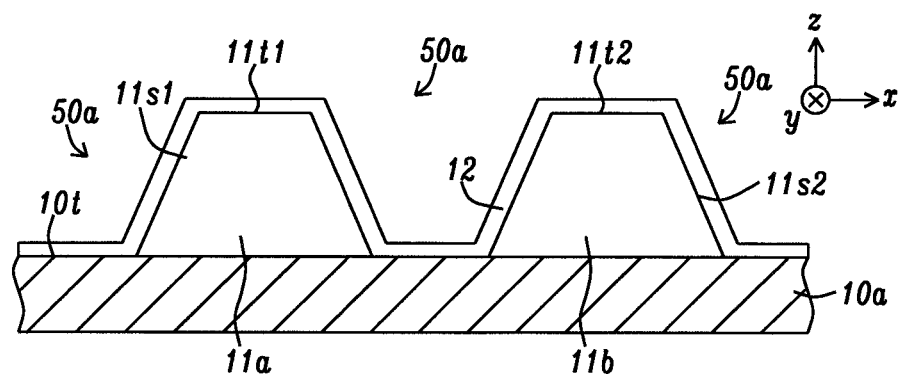

Referring to FIG. 3, a conventional process is used to remove photoresist islands 30a, 30b. Then, a single passivation layer 12 made of B, C, or Ge is deposited on top surface 10t, and on the array of MTJs including top surfaces 11t1 and 11t2, and sidewalls 11s1 and 11s2 of MTJ 11a and MTJ 11b, respectively. Accordingly, each opening 50 shrinks in size to an opening 50a. A magnetron sputtering process, PVD, CVD, or atomic layer deposition (ALD) process may be employed to deposit the passivation layer. In a preferred embodiment, the deposition process is performed in the absence of a reactive species including nitrogen containing and oxygen containing gases and plasmas. Furthermore, the passivation layer may be deposited with a RF power in the range of 100 to 1000 Watts and with a chamber pressure of 0.05 to 20 mtorr to prevent erosion of MTJ sidewalls.

Preferably, the passivation layer is conformally deposited with a thickness on sidewalls 11s1 and 11s2 that is essentially equivalent to a thickness on bottom electrode top surface 10t. Although it is difficult to measure thin passivation layer thicknesses on the order of 5-10 Angstroms during device fabrication, an independent experiment may be performed where a substantially thicker film of B, for example, is deposited on a planar (non-product) substrate during a time period "d". Once the B film thickness "t" is measured by a transmission electron microscope (TEM) technique, a deposition rate "t/d" in Angstroms per minute is determined for the deposition process. Then, the deposition rate is used to calculate a deposition time substantially less than "d" to yield a thin passivation layer about 5-10 Angstroms thick on substrates comprising MTJs 11a, 11b.

Figure 4:
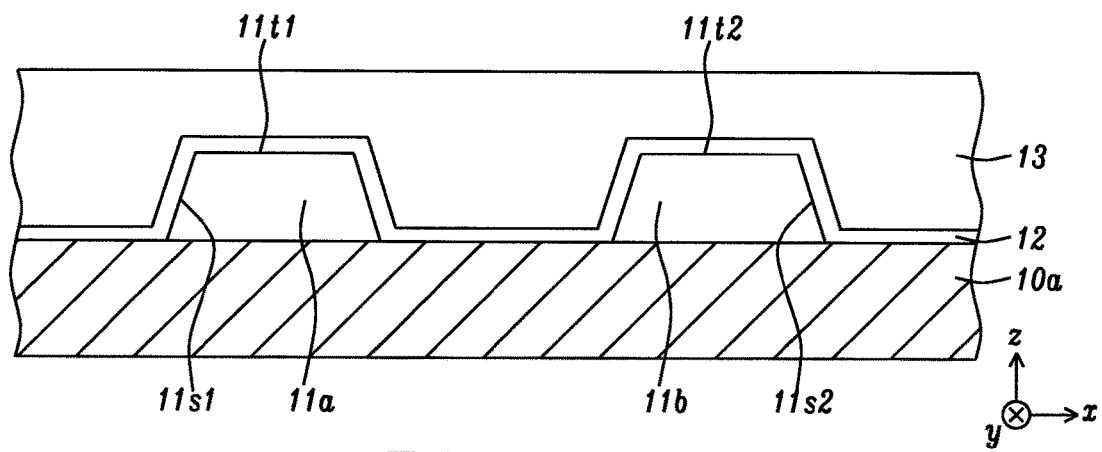

Referring to FIG. 4, a dielectric layer 13 is deposited on passivation layer 12 by a conventional method to a level that fills openings 50a. Although deposition of the dielectric layer typically includes reactive oxygen or nitrogen species, MTJ sidewalls 11s1, 11s2 are protected from the reactive species by the presence of the passivation layer. The dielectric layer may be comprised of one or more oxides, nitrides, oxynitrides, or carbides used in the art for electrical insulation purposes, and is typically deposited with a physical vapor deposition (PVD) or plasma enhanced chemical vapor deposition (PECVD) technique.

Figure 5:
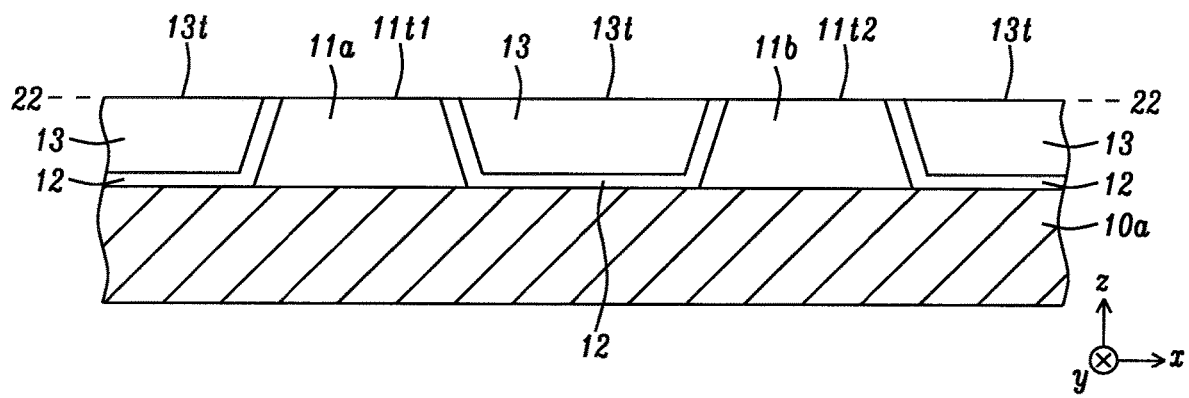

According to one embodiment shown in FIG. 5, a well known chemical mechanical polish (CMP) process is performed to remove an upper portion of the dielectric layer 13 such that the partially formed memory device has a top surface along plane 22-22 that includes dielectric layer top surface 13t and top surfaces 11t1 and 11t2 of MTJ 11a and MTJ 11b, respectively. In some embodiments, the uppermost MTJ layer is a hard mask such as MnPt with a top surface that is 11t1 or 11t2. In other embodiments, the uppermost MTJ layer is a capping layer such as Ru, or having a Ru/Ta/Ru configuration, for example.

Returning to FIG. 1, a subsequent sequence of steps well known in the art is followed and includes photoresist patterning and etch processes that are used to form a top electrode layer with top electrodes 14a, 14b within insulation layer 15 wherein top electrode 14a adjoins the top surface of MTJ 11a, and top electrode 14b contacts the top surface of MTJ 11b. As mentioned previously, the top electrode layer typically comprises a plurality of top electrodes formed in an array of parallel lines, for example, but only two top electrodes are shown in the exemplary embodiment. The insulation layer may be silicon oxide or alumina, or other dielectric materials that are used in the art to electrically isolate adjacent conductive elements.

Figure 7:
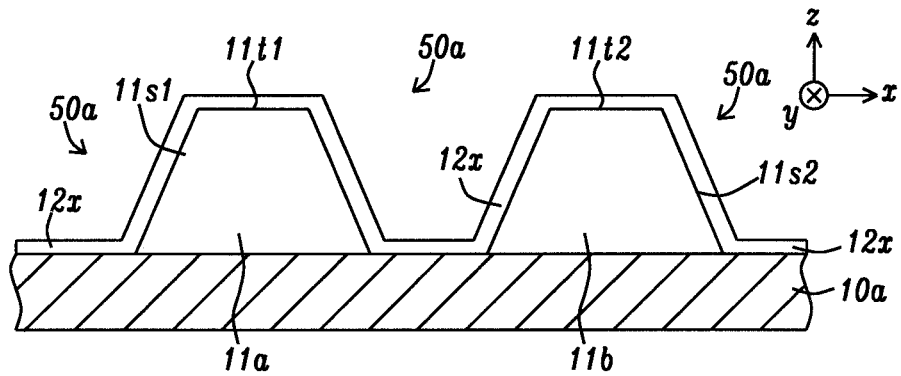
Figure 9:
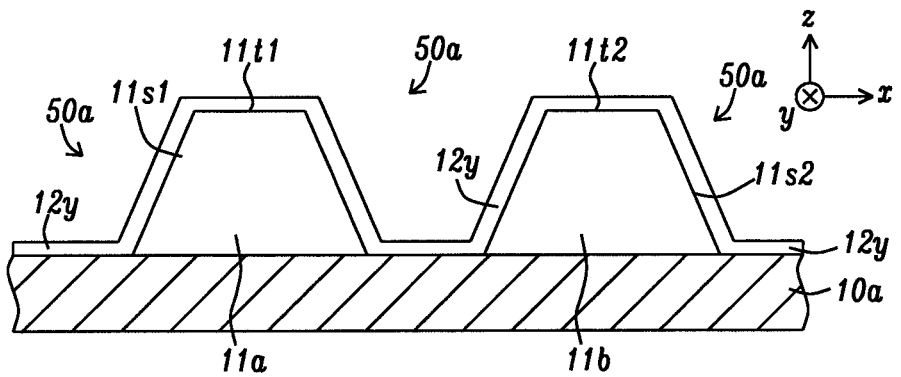
Figure 11:
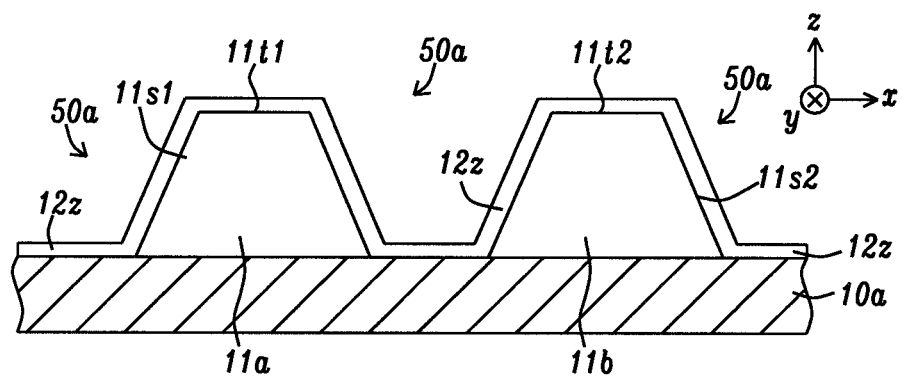

It should be understood that passivation layer 12 in FIG. 1 may be replaced by passivation layer 12x, passivation layer 12y, or passivation layer 12z that are described in embodiments relating to FIG. 7, FIG. 9, and FIG. 11, respectively.

Figure 6:
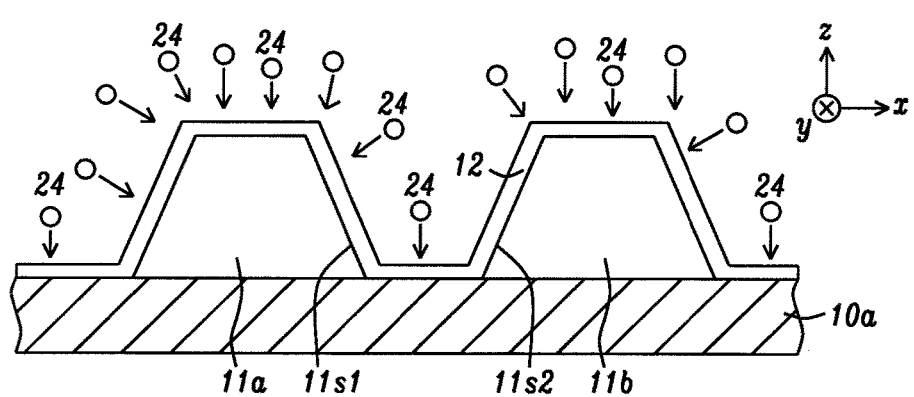
FIGS. 6-7 are cross-sectional views of a process that converts the passivation layer in FIG. 3 to an oxide, nitride, or oxynitride passivation layer according to an embodiment of the present disclosure.

According to another single layer embodiment depicted in FIG. 6, passivation layer 12 previously described with regard to FIG. 3 is subjected to an oxidation process such as a natural oxidation (NOX) with oxygen species 24. The NOX process may comprise an oxygen flow rate of 1 to 10 standard cubic centimeters per minute (sccm) for a period of 10 to 600 seconds. In an alternative embodiment, a nitridation involving nitrogen species 24 is performed on a single passivation layer comprised of B, C, or Ge. Furthermore, species 24 may include both of a reactive oxygen species and reactive nitrogen species in an oxynitridation process. It is important that the oxidation and nitridation conditions be sufficiently mild to prevent oxygen or nitrogen species from penetrating the passivation layer and reacting with the MTJ sidewalls 11s1, 11s2. As a result, essentially all of a B passivation layer may be converted to a BO, BN, or BON layer, a C passivation layer may be converted to a CO, CN, or CON layer, and a Ge passivation layer may be converted to a GeO, GeN, or GeON layer.

The present disclosure also encompasses an embodiment where a BN, BO, BON, CN, CO, CON, GeN, GeO, or GeON target is used to deposit a single passivation layer 12x on MTJ sidewalls 11s1, 11s2 as depicted in FIG. 7. For example, a BN, CN, or GeN target may be sputter deposited in the presence of an inert gas but without a reactive nitrogen species to form a BN, CN, or GeN passivation layer, respectively. Likewise, a BO, CO, or GeO target may be employed with an inert gas in the absence of a reactive oxygen species to form a BO, CO, or GeO passivation layer, respectively, on MTJ sidewalls.

As shown in FIG. 7, the initially deposited passivation layer 12 reacts with one or both of a reactive oxygen and nitrogen species 24 in FIG. 6 and is thereby transformed to passivation layer 12x. In one aspect, only a portion of the B, C, or Ge passivation layer is converted to an oxide, nitride, or oxynitride thereof while a certain number of B, C, or Ge atoms remain to yield a non-stoichiometric oxidation state and/or non-stoichiometric nitridation state in passivation layer 12x. Depending on the length of the oxidation, nitridation, or oxynitridation process, and the concentration of the oxygen or nitrogen species in the reaction chamber, passivation layer 12 may be completely converted to an oxide, nitride, or oxynitride in passivation layer 12x to form a so-called stoichiometric oxidation or stoichiometric nitridation state. The present disclosure also encompasses an embodiment where a B, C, or Ge passivation layer 12 reacts with an oxygen species, nitrogen species, or both species during subsequent processing when an oxide, nitride, or oxynitride dielectric layer 13 is deposited on passivation layer 12. As a result, the initially deposited B, C, or Ge passivation layer is converted to an oxide, nitride, or oxynitride passivation layer 12x with a non-stoichiometric or stoichiometric oxidation state or nitridation state, respectively, such that passivation layer 12 in FIG. 1 is replaced with passivation layer 12x.

Figure 8:
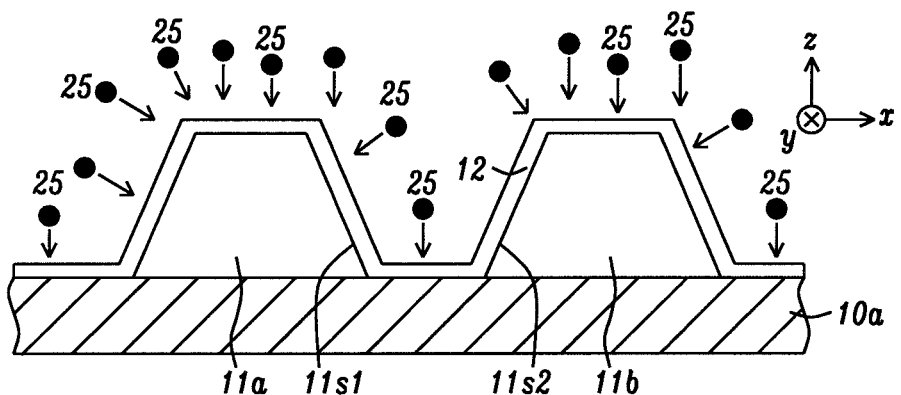
FIGS. 8-9 are cross-sectional views of a process where an element X reacts with the passivation layer in FIG. 3 to form a single alloy passivation layer according to an embodiment of the present disclosure.

According to another embodiment of the present disclosure shown in FIGS. 8-9, two deposition steps are performed to yield a single passivation layer having a BX, CX, or GeX alloy composition. In particular, passivation layer 12 is formed as described earlier with regard to FIG. 3. Thereafter, an X element 25 in FIG. 8 is sputter deposited on the B, C, or Ge layer where X is one of B, C, Ge, Si, Al, P, Ga, In, Tl, Mg, Hf, Zr, Nb, V, Ti, Cr, Mo, W, Sr, and Zn, and where X is unequal to the other element in the alloy. In other words, the initially deposited B, C, or Ge layer serves as a sacrificial material and is completely resputtered during the X deposition, and combines with the X element to form an alloy passivation layer 12y in FIG. 9. Preferably, B in a BX alloy, C in a CX alloy, and Ge in a GeX alloy has a content of at least 10 atomic %. As in previous embodiments, the passivation layer has a minimum thickness of 3 Angstroms and a maximum thickness of about 10-20 Angstroms, and preferably forms a conformal layer on MTJ sidewalls 11s1, 11s2, on MTJ top surfaces 11t1, 11t2, and on exposed regions of bottom electrode top surface 10t. Depending on passivation layer composition, the optimum benefits of the present disclosure are achieved with a passivation layer thickness of 5 to 10 Angstroms.

Figure 10:
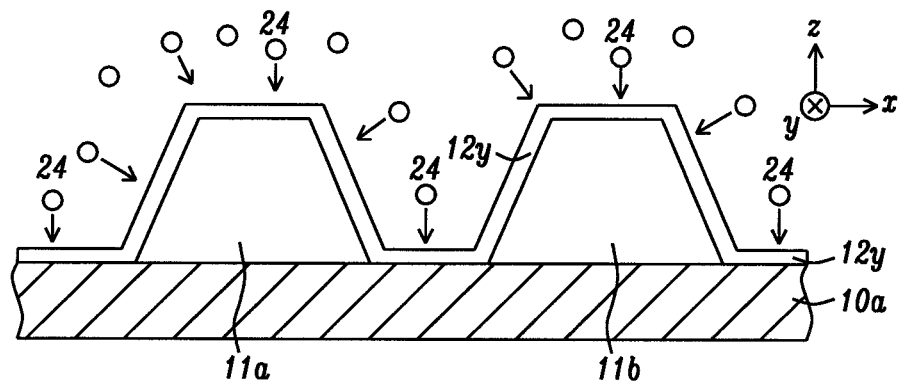
FIGS. 10-11 are cross-sectional views of a process where the single alloy passivation layer in FIG. 9 is subjected to an oxidation, nitridation, or oxynitridation process according to embodiment of the present disclosure.

Another single passivation layer embodiment is shown in FIGS. 10-11. In FIG. 10, the BX, CX, or GeX alloy passivation layer 12y in FIG. 9 is treated with a species 24 comprised of one or both of a reactive oxygen and reactive nitrogen species. FIG. 11 shows the process in FIG. 10 yields an oxide, nitride, or oxynitride passivation layer 12z that may have a stoichiometric or non-stoichiometric oxidation or nitridation state. Thus, the oxidized alloy BXO, CXO, or GeXO, or the nitrided alloy BXN, CXN, or GeXN, or the oxynitrided alloy BXON, CXON, or GeXON in passivation layer 12z may have a certain number of unreacted BX, CX, or GeX alloy molecules. However, essentially all of alloy layer 12y may be oxidized, nitrided, or oxynitrided under certain conditions such that no BX, CX, or GeX alloy remains in passivation layer 12z.

Figure 12:
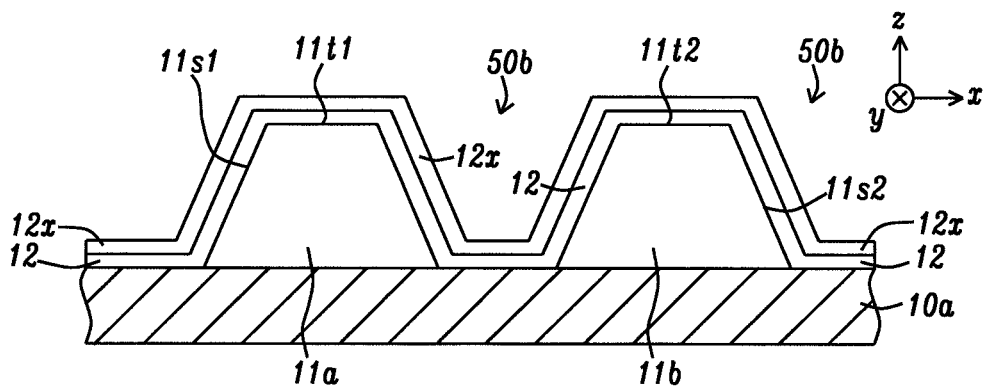
FIG. 12 is a cross-sectional view of an embodiment described herein where the process in FIG. 6 forms a bilayer structure for the passivation layer.

Referring to FIG. 12, the present disclosure also includes an embodiment where a passivation layer with a bilayer structure is formed before or during deposition of dielectric layer 13. For example, the conditions shown in the oxidation, nitridation, or oxynitridation process comprising reactive species 24 in FIG. 6 may be controlled to the extent that only an upper portion of passivation layer 12 is converted to an oxide, nitride, or oxynitride passivation layer 12x. Optionally, reactive species 24 are provided during deposition of the dielectric layer. In either case, a bilayer is formed with a lower passivation layer 12 adjoining MTJ sidewalls 11s1, 11s2, and MTJ top surfaces 11t1, 11t2, and an upper passivation layer 12x on the surface of the lower passivation layer to give a B/BO, C/CO, Ge/GeO, B/BN, C/CN, Ge/GeN, B/BON, C/CON, or Ge/GeON configuration. The bilayer scheme is advantageous over a single layer of B, C, or Ge in that an oxide or nitride passivation layer 12x generally has better adhesion than passivation layer 12 to the subsequently deposited dielectric layer 13.

Figure 13:
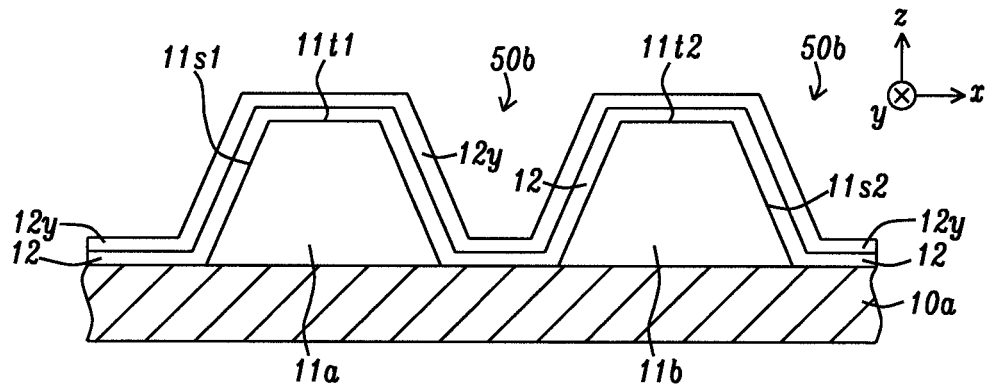
FIG. 13 is a cross-sectional view of an embodiment described herein where the process in FIG. 8 forms a bilayer structure for the passivation layer.

Another embodiment of the present disclosure is illustrated in FIG. 13. There is a bilayer structure for the passivation layer comprising a lower passivation layer 12 and an upper passivation layer 12y on an upper surface of the lower passivation layer. This bilayer scheme results from the process shown in FIG. 8 where the X element deposition is controlled to an extent such that only an upper portion of passivation layer 12 is resputtered to form the BX, CX, or GeX alloy passivation layer 12y. This bilayer scheme is represented by a B/BX, C/CX, or Ge/GeX configuration. Opening 50b is smaller than opening 50a because the two layer stack 12/12y has a greater thickness than the single passivation layer 12 in FIG. 3.

Figure 14:
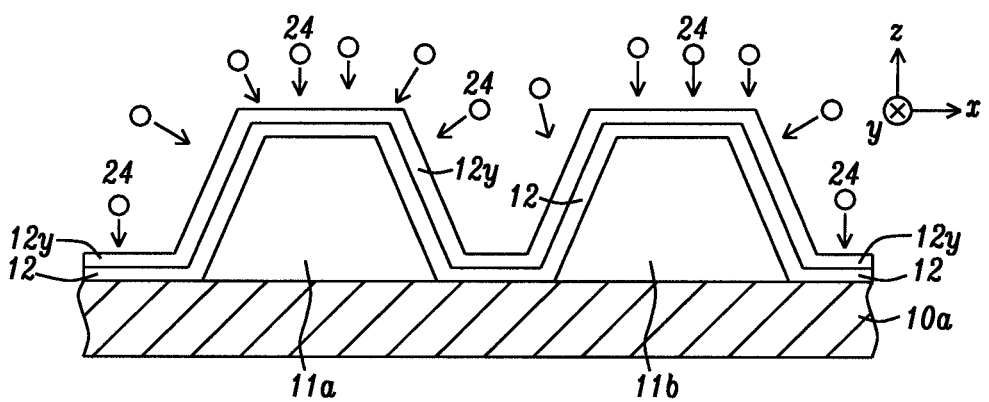
FIG. 14 is a cross-sectional view of an embodiment described herein where the bilayer structure in FIG. 13 is subjected to an oxidation, nitridation, or oxynitridation process.
Figure 16:
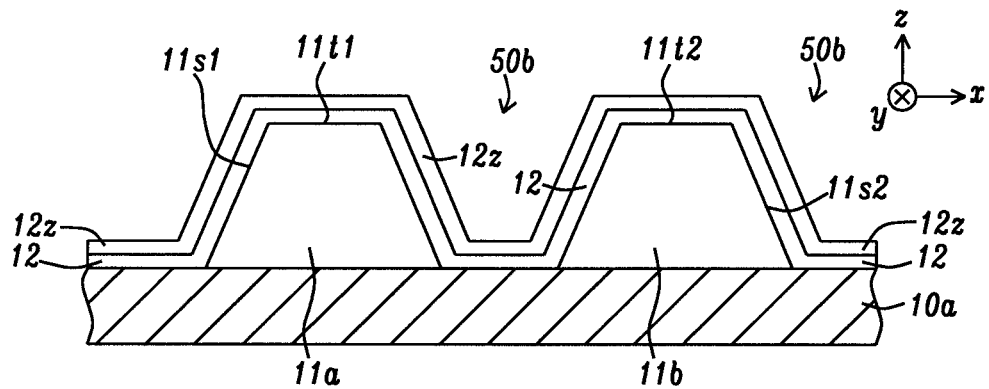

As shown in FIG. 14, the present disclosure anticipates an oxidation, nitridation, or oxynitridation process with species 24 after the bilayer stack 12/12y is formed in FIG. 13. In one embodiment, passivation layer 12y is partially or totally oxidized (or nitrided or oxynitrided) to form the bilayer stack 12/12z where passivation layer 12z has a BXO, CXO, GeXO, BXN, CXN, GeXN, BXON, CXON, or GeXON composition that is depicted in FIG. 16. In other words, the oxidation and nitridation process conditions are sufficiently mild so that a continuous passivation layer 12 remains in place on MTJ sidewalls and top surfaces and only outer layer 12y reacts with species 24 to form layer 12z.

Figure 15:
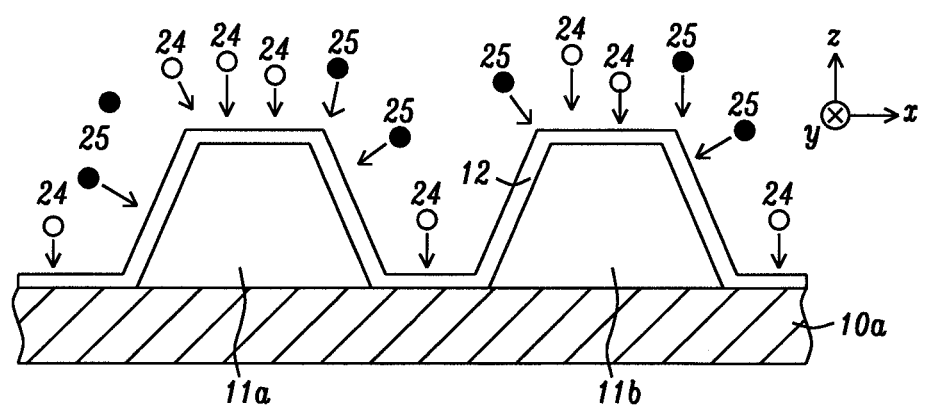
FIGS. 15-16 are cross-sectional views of an embodiment described herein where an element X is sputter deposited in the presence of one or both of an oxygen and nitrogen species on the single passivation layer in FIG. 3 to provide a passivation layer with a bilayer structure.

FIG. 15 shows an alternative method of forming the passivation layer having the 12/12z bilayer stack in FIG. 16. Note that during deposition of the X element 25 on passivation layer 12, species 24 may be included in the reaction chamber. Moreover, the deposition conditions are controlled to the extent that only an upper region of passivation layer 12 is resputtered to provide a B/BXO, C/CXO, or a Ge/GeXO bilayer from an oxidation process, a B/BXN, C/CXN, or a Ge/GeXN bilayer from a nitridation process, or a B/BXON, C/CXON, or a Ge/GeXON bilayer from an oxynitridation process.

Figure 17:
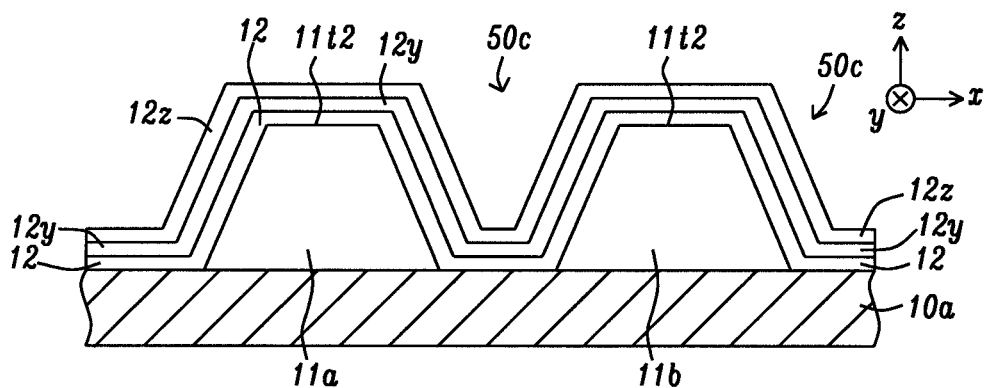
FIG. 17 is a cross-sectional view of a passivation layer with a trilayer structure that is formed by the process in FIG. 14 according to an embodiment of the present disclosure.

As indicated in FIG. 17, the present disclosure includes an embodiment where a trilayer stack is formed as a passivation layer. According to one embodiment, the process shown in FIG. 14 may be controlled to the extent that only an upper portion of the BX, CX, or GeX layer 12y is oxidized, nitrided, or oxynitrided to form an uppermost passivation layer 12z. Thus, a B/BX/BXO, C/CX/CXO, or Ge/GeX/GeXO trilayer is fabricated when species 24 in FIG. 14 represent an oxidation process. Alternatively, a B/BX/BXN, C/CX/CXN, or Ge/GeX/GeXN trilayer is formed when species 24 in FIG. 14 is employed in a nitridation process, or a B/BX/BXON, C/CX/CXON, or Ge/GeX/GeXON trilayer is formed from an oxynitridation process.

Figure 18:
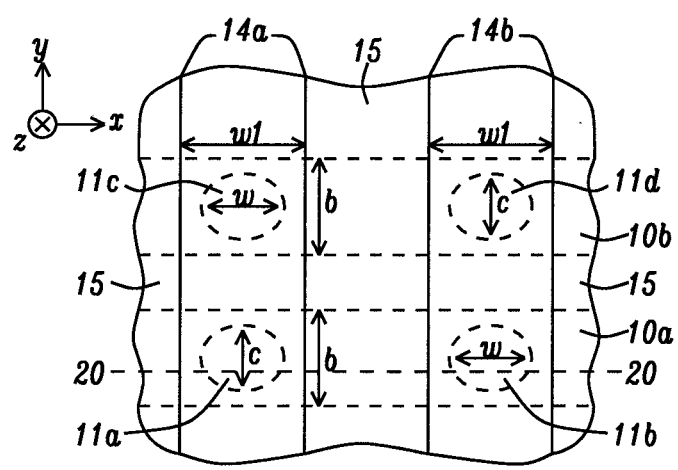
FIG. 18 is a top-down view of the memory structure in FIG. 1 that includes a plurality of MTJ elements formed in rows and columns between a bottom electrode layer and a top electrode layer.

Referring to FIG. 18, a top-down view of the memory structure in FIG. 1 is depicted. Plane 20-20 indicates the location where the cross-sectional view in FIG. 1 is taken. In the exemplary embodiment where an additional two MTJs 11c and 11d are shown between a second bottom electrode 10b and top electrodes 14a, 14b, respectively, the width w1 of the top electrodes is preferably greater than the width w of the MTJs 11a-11d. Also a length b of the bottom electrodes 10a, 10b in the y-axis direction is typically greater than the length c of the MTJs. The MTJs have a substantially circular shape that may be a circle or ellipse. In other embodiments, the MTJs may have a polygonal shape such as a square or rectangle.

Figure 19:
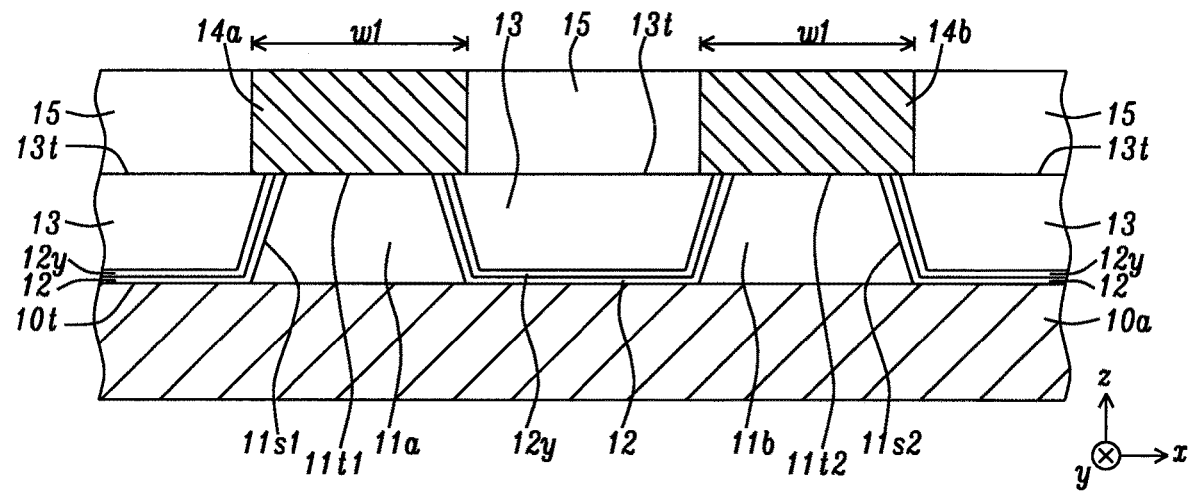
FIG. 19 is a cross-sectional view of another embodiment of the present disclosure wherein a memory structure comprises a passivation layer that is formed on MTJ sidewalls, and the passivation layer has a bilayer configuration.

Referring to FIG. 19, a modification of the memory device in FIG. 1 is shown where all layers are retained except passivation layer 12 is replaced with a bilayer structure. In the exemplary embodiment, the bilayer has a 12/12y stack as explained earlier with regard to FIG. 13. However, the bilayer may also have a 12/12x stack depicted in FIG. 12, or a 12/12z configuration shown in FIG. 16.

Figure 20:
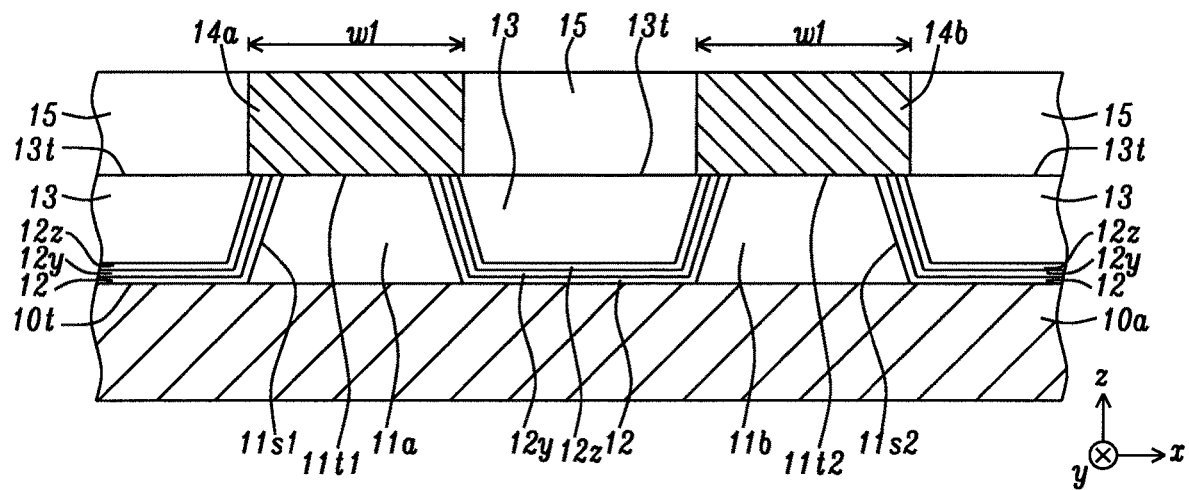
FIG. 20 is a cross-sectional view of another embodiment of the present disclosure wherein a memory structure comprises a passivation layer that is formed on MTJ sidewalls, and the passivation layer has a trilayer configuration.

Referring to FIG. 20, a modification of the memory device in FIG. 1 is shown where all layers are retained except passivation layer 12 is replaced with a trilayer structure. In the exemplary embodiment, the trilayer has a 12/12y/12z stack as explained earlier with regard to FIG. 17.

Figure 21:
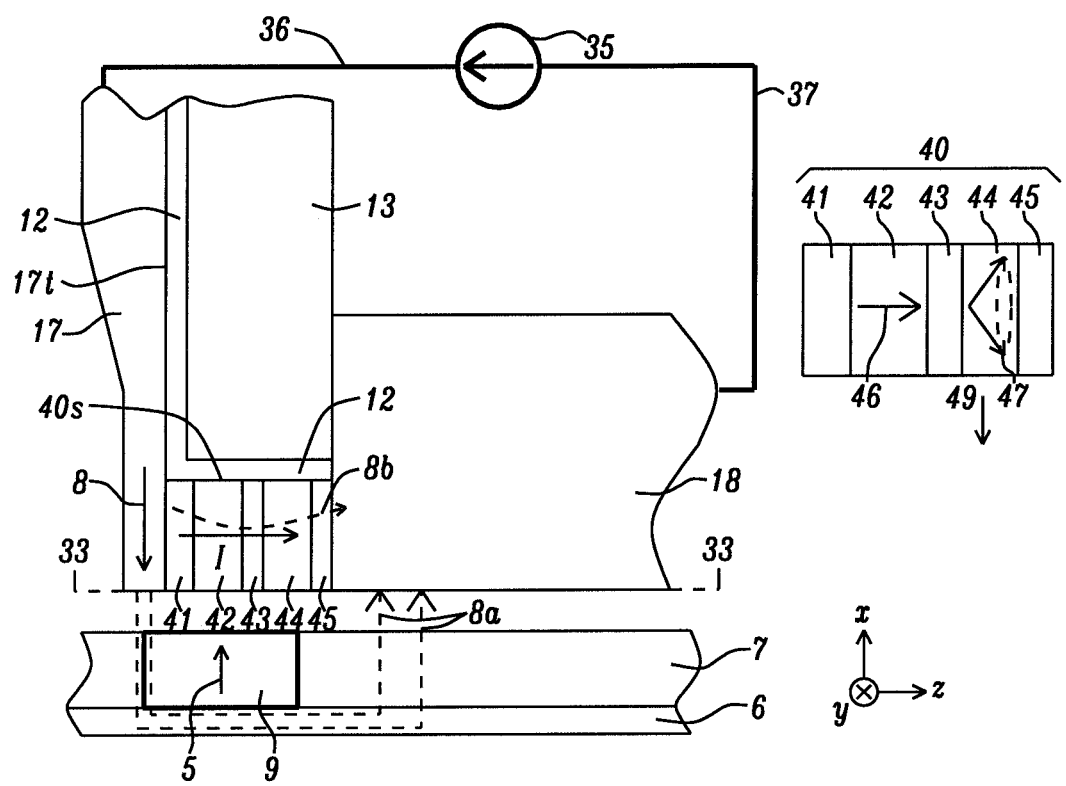
FIG. 21 is a cross-sectional view of another embodiment of the present disclosure wherein a STO device has a sidewall that is protected by a passivation layer, and a dielectric layer is formed on the passivation layer.

In FIG. 21, another embodiment of the present disclosure is shown where the passivation layer 12 described previously may be employed as a protective measure in a STO device. A STO device 40 is formed between a main pole layer 17 and trailing shield 18. In this case, a direct current (100% duty cycle) or pulsed current I flows from a source 35 through lead 36 to main pole 17 and then passes through STO 40 and trailing shield 18 before exiting through lead 37.

The pulsed current may be at a scale of 0.1 ns "on" followed by an off period of a fraction of a nanosecond to multiple nanoseconds. The STO 40 may have a bottom spin valve configuration wherein a seed layer 41, spin polarization (SP) layer 42, non-magnetic spacer 43, oscillation layer (OL) 44, and capping layer 45 are sequentially formed on the main pole such that a bottom surface of the seed layer contacts the main pole and a top surface of the capping layer contacts the trailing shield. One or both layers 41, 43 are a metal oxide to induce perpendicular magnetic anisotropy (PMA) 46 in the SP layer. The z-axis is the medium moving direction and is the down-track direction.

During a write process, magnetic flux 8 passes through the ABS 33-33 and transits the magnetic medium 7 and soft underlayer 6 and flux 8a re-enters the write head through trailing shield 18. Under a gap field 8b of several thousand Oe and a dc bias across the STO, the write process is assisted by a spin polarized current passing from the SP layer 42 to the OL 44 with sufficient magnitude (critical current density) to cause a large angle oscillation 47 with a certain amplitude and frequency in the OL that imparts a rf field 49 on medium bit 9. The combined effect of the rf field and magnetic field 8 enables the magnetization 5 in the bit to be switched with a lower magnetic field than when only magnetic field 8 is applied.

The STO device 40 is considered to be a MTJ where the SP layer 42 serves as a reference layer, the non-magnetic spacer 43 is a tunnel barrier, and OL layer 44 is effectively a free layer. The composition of layers 41-45 is described in detail in related U.S. Pat. No. 9,230,571. A key feature of the present disclosure is that passivation layer 12 is formed on a trailing side 17t of the main pole and on a sidewall 40s of STO 40 thereby protecting the sidewall during deposition of dielectric layer 13 that is formed between main pole layer 17 and trailing shield 18. As a result, the STO device retains structural integrity during subsequent fabrication steps unlike the prior art where the STO sidewall is susceptible to damage by reactive gases used in the deposition of the dielectric layer.

Figure 22:
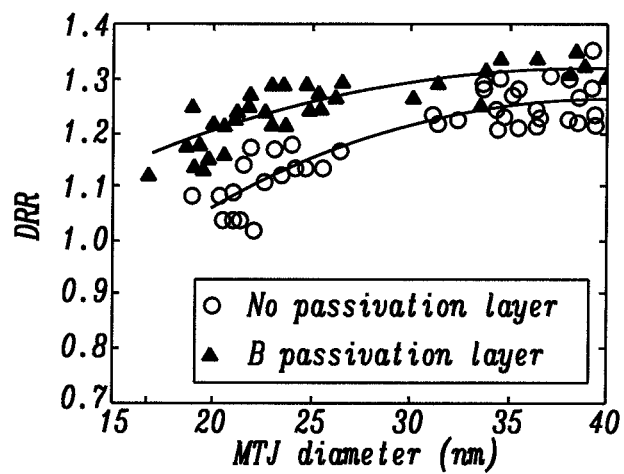
FIG. 22 is a plot of magnetoresistive ratio (dR/R) as a function of MTJ size that shows a comparison of MTJs having no protective passivation layer with MTJs having a protective B passivation layer and formed according to an embodiment of the present disclosure.

Referring to FIG. 22, an experiment was conducted to demonstrate the improved performance achieved by implementing a protective passivation layer on MTJ sidewalls according to an embodiment of the present disclosure. A series of MTJ elements were fabricated in a circular shape (w=c in FIG. 18) wherein the diameter w was varied from around 20 nm to 40 nm. For each MTJ size, half of the samples were not protected with a passivation layer, and half of the samples were protected by a 5 Angstrom thick B passivation layer that was deposited in an Anelva sputter deposition chamber with the following conditions: 600 Watts RF power; an Ar flow rate of 150 standard cubic centimeters per minute (sccm); a B target to substrate distance of 240 mm to give a B deposition rate of 0.18 Angstrom/sec. according to TEM analysis. Thus, a plurality of different MTJ sizes was fabricated and a TMR ratio (dR/R) was measured at 25° C. for each with an Accretech UF300A prober. TMR ratio is also expressed as (Rp-Rap)/Rp×100 where Rp and Rap are the resistance at parallel and anti-parallel configurations, respectively, for the reference layer and free layer in a MTJ element. Each MTJ lot was annealed at 400° C. for 2.5 hours prior to the TMR measurement.

Results in FIG. 22 show that MTJs with a protective B passivation layer exhibited a higher dR/R than MTJs fabricated by a process of record (POR), which does not involve depositing a passivation layer on MTJ sidewalls, especially for MTJ diameters between 20 nm and 35 nm.

Figure 23:
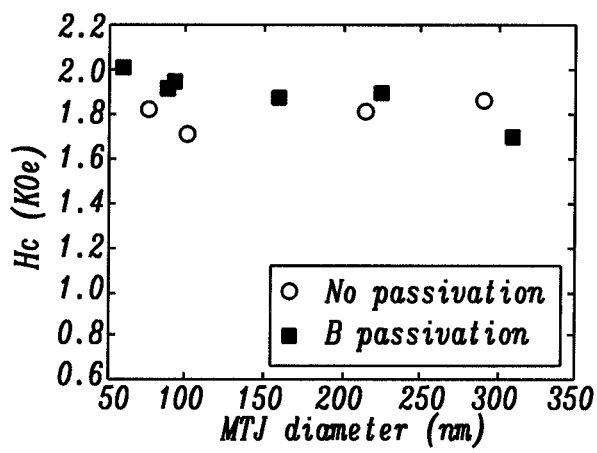
FIG. 23 is a plot showing Hc as a function of MTJ size for MTJs having no protective passivation layer, and for MTJs having a protective B passivation layer formed according to an embodiment of the present disclosure.

In FIG. 23, coercivity (Hc) is plotted as a function of MTJ diameter that ranges from 50 to 300 nm. Again, MTJs with a protective B passivation layer (5 Angstroms thick) were found to have higher performance (larger Hc) than POR MTJs, and in particular for the smaller MTJ sizes from 50 nm to 250 nm. In this case, the results were measured at 125° C. using an Accretech UF300A prober.

Figure 24:
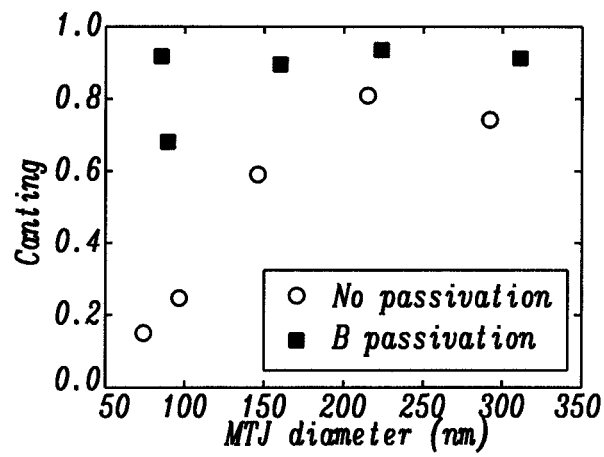
FIG. 24 is a plot showing canting as a function of MTJ size for MTJs having no protective passivation layer, and for MTJs having a protective B passivation layer formed according to an embodiment of the present disclosure.

Referring to FIG. 24, we have found that canting is significantly improved when a 5 Angstroms thick protective passivation layer is formed on MTJ sidewalls compared with reference POR MTJs with no passivation layer. Canting results were also determined at 125° C. with the Accretech UF300A prober. Canting values on the y-axis relate to the parallel nature of the magnetic moments of the AP1 and AP2 sub-layers in a MTJ where the reference layer has a synthetic anti-parallel (SyAP) configuration represented by AP2/coupling layer/AP1 stack of layers. Ideally, the middle anti-ferromagnetic coupling layer results in AP2 and AP1 layers with magnetic moments that are aligned essentially parallel to each other, either in a perpendicular-to-plane direction or in an in-plane direction. However, certain factors disturb a perfectly parallel relationship (y-axis value=1) so that that the magnetic moments of AP1 and AP2 layers approach an orthogonal alignment to each other (y-axis value proximate to 0). In actual practice, a canting value≥0.9 indicating a substantially parallel alignment of AP1 and AP2 magnetic moments is required for high performance in a MTJ. Unlike the reference POR MTJs where all canting values are below 0.9, most of the MTJs meet or exceed the minimum canting value required for optimum performance when sidewalls thereof adjoin a 5 Angstroms thick B passivation layer formed according to an embodiment of the present disclosure.

The one or more additional deposition steps and minimal cost required to form a protective passivation layer described herein is considered insignificant when compared with the substantial cost involved in attempting to repair a POR MTJ that was damaged during dielectric layer deposition, and the waste (lower yield) associated with POR MTJs that are damaged beyond repair. The protective passivation layers of the present disclosure may be deposited by employing conventional tools and materials used in the art.

While this disclosure has been particularly shown and described with reference to, the preferred embodiment thereof, it will be understood by those skilled in the art that various changes in form and details may be made without departing from the spirit and scope of this disclosure.

What is claimed is:

1. A method, comprising:
   forming a magnetic tunnel junction (MTJ) on a top surface of a substrate, wherein the MTJ has a MTJ top surface and MTJ sidewalls that extends from the MTJ top surface to the top surface of the substrate;
   depositing a passivation layer that is non-magnetic, the passivation layer including one or more layers selected from the group consisting of a BSi-containing layer, a BX alloy-containing layer, a CX alloy-containing layer, a GeSi-containing layer, and a GeX alloy-containing layer, wherein X is one of B, C, Ge, Al, P, Ga, In, Tl, Mg, Hf, Zr, Nb, V, Ti, Cr, Mo, W, Sr, and Zn, and wherein the passivation layer is deposited on exposed portions of the top surface of the substrate, the MTJ sidewalls, and the MTJ top surface;
   subjecting the passivation layer to an oxidation, nitridation, or oxynitridation process such that a first layer of the one or more layers of the passivation layer is entirely transformed to an oxide, nitride, or oxynitride, respectively, of the BSi-containing layer, the BX alloy-containing layer, the CX alloy-containing layer, the GeSi-containing layer, or the GeX alloy-containing layer; and depositing a dielectric layer on the passivation layer, wherein the dielectric layer electrically isolates the MTJ from another MTJ.

2. The method of claim 1, further comprising:
planarizing the dielectric layer such that a top surface of the dielectric layer is substantially aligned with the MTJ top surface; and
performing an anneal process at a temperature of about 400° C.

3. The method of claim 1, wherein the substrate is a bottom electrode in a MRAM or spin torque MRAM.

4. The method of claim 1, wherein the substrate is a main pole layer in a spin torque oscillator.

5. The method of claim 1, wherein at least one layer of the one or more layers of the passivation layer has a thickness from about 3 Angstroms to about 10 Angstroms.

6. The method of claim 1, wherein a concentration of X in the BX alloy of the BX alloy-containing layer, the CX alloy of the CX alloy-containing layer, or the GeX alloy of the GeX alloy-containing layer is at least 10 atomic %.

7. The method of claim 1, wherein the subjecting the passivation layer to the oxidation, nitridation, or oxynitridation process subjects the first layer of the one or more layers of the passivation layer to the oxidation process before depositing the dielectric layer to form the oxide of the BSi-containing layer, the BX alloy-containing layer, the CX alloy-containing layer, the GeSi-containing layer, or the GeX alloy-containing layer.

8. The method of claim 7, wherein the oxidation process includes a natural oxidation with an oxygen flow rate from about 1 standard cubic centimeters per minute (sccm) to about 10 sccm for a period from about 10 seconds to about 600 seconds.

9. The method of claim 1, wherein the subjecting the passivation layer to the oxidation, nitridation, or oxynitridation process subjects the first layer of the one or more layers of the passivation layer to the nitridation process before depositing the dielectric layer to form the nitride of the BSi-containing layer, the BX alloy-containing layer, the CX alloy-containing layer, the GeSi-containing layer, or the GeX alloy-containing layer.

10. A method, comprising:
forming a plurality of magnetic tunnel junctions (MTJs) on a top surface of a substrate, wherein each of the plurality of MTJs has a MTJ top surface and a MTJ sidewall that extends from the MTJ top surface to the top surface of the substrate;
forming a first passivation layer on exposed portions of the top surface of the substrate, the MTJ sidewalls, and the MTJ top surfaces, the first passivation layer being a boron (B)-containing layer, a carbon (C)-containing layer, or a germanium (Ge)-containing layer; and
depositing Si or an X element on the first passivation layer such that an upper portion of the first passivation layer is resputtered to form a second passivation layer, wherein X is one of B, C, Ge, Al, P, Ga, In, Tl, Mg, Hf, Zr, Nb, V, Ti, Cr, Mo, W, Sr, and Zn, and wherein the second passivation layer is one of a BSi-containing layer, a BX alloy-containing layer, a CX alloy-containing layer, a GeSi-containing layer, or a GeX alloy-containing layer.

11. The method of claim 10, further comprising subjecting the second passivation layer to an oxidation, nitridation, or oxynitridation process such that an upper portion of the second passivation layer is converted to a third passivation layer that is an oxide, nitride, or oxynitride of the second passivation layer.

12. The method of claim 10, further comprised of subjecting the second passivation layer to an oxidation, nitridation, or oxynitridation process such that an entirety of the second passivation layer is converted to an oxide, nitride, or oxynitride of the BSi-containing layer, the BX alloy-containing layer, the CX alloy-containing layer, the GeSi-containing layer, or the GeX alloy-containing layer.

13. The method of claim 10, wherein forming the first passivation layer includes a sputter deposition process with a radio frequency (RF) power from about 100 Watts to about 1000 Watts, and a chamber pressure from about 0.05 mTorr to about 20 mTorr.

14. A method, comprising:
forming a magnetic tunnel junction (MTJ) on a top surface of a substrate, wherein the MTJ has MTJ sidewalls that extends from a MTJ top surface to the top surface of the substrate;
forming a passivation layer having one or more layers on the MTJ sidewalls, the MTJ top surface, and exposed portions of the top surface of the substrate in an absence of a reactive oxygen species or a reactive nitrogen species, wherein a first layer of the one or more layers of the passivation layer has a thickness from about 3 Angstroms to about 10 Angstroms; and
forming a dielectric layer on the passivation layer.

15. The method of claim 14, wherein the one or more layers of the passivation layer is selected from the group consisting of a boron (B)-containing layer, a BSi-containing layer, a BX alloy-containing layer, a carbon (C)-containing layer, a CX alloy-containing layer, a germanium (Ge)-containing layer, a GeSi-containing layer, and a GeX alloy-containing layer, wherein X is one of B, C, Ge, Al, P, Ga, In, Tl, Mg, Hf, Zr, Nb, V, Ti, Cr, Mo, W, Sr, and Zn.

16. The method of claim 14, wherein the one or more layers of the passivation layer is selected from the group consisting of a BN-containing layer, a BO-containing layer, a BON-containing layer, a CN-containing layer, a CO-containing layer, a CON-containing layer, a GeN-containing layer, a GeO-containing layer, or a GeON-containing layer.

17. The method of claim 14, wherein the first passivation layer is selected from the group consisting of a boron (B)-containing layer, a carbon (C)-containing layer, and a germanium (Ge)-containing layer.

18. The method of claim 14, subjecting the first passivation layer to an oxidation, nitridation, or oxynitridation process such that only a portion of the first passivation layer is transformed to an oxide, nitride, or oxynitride, respectively, of the boron (B)-containing layer, the carbon (C)-containing layer or the germanium (Ge)-containing layer.

19. The method of claim 14, wherein the one or more layers of the passivation layer is selected from the group consisting of a BX alloy-containing layer, CX alloy-containing layer and a GeX alloy-containing layer, and
wherein X is one of B, C, Ge, Al, P, Ga, In, Tl, Mg, Hf, Zr, Nb, V, Ti, Cr, Mo, W, Sr, and Zn.

20. The method of claim 14, further comprising directing Si or an X element at the first passivation layer such that an upper portion of the first passivation layer is resputtered to form a second passivation layer, wherein X is one of B, C, Ge, Al, P, Ga, In, Tl, Mg, Hf, Zr, Nb, V, Ti, Cr, Mo, W, Sr, and Zn.

* * * * *